(12) United States Patent
Oguz et al.

(10) Patent No.: US 11,295,884 B2
(45) Date of Patent: Apr. 5, 2022

(54) PERPENDICULAR STTM MULTI-LAYER INSERT FREE LAYER

(71) Applicant: INTEL CORPORATION, Santa Clara, CA (US)

(72) Inventors: Kaan Oguz, Portland, OR (US); Kevin P. O'Brien, Portland, OR (US); Brian S. Doyle, Portland, OR (US); Charles C. Kuo, Hillsboro, OR (US); Mark L. Doczy, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 404 days.

(21) Appl. No.: 16/329,309

(22) PCT Filed: Sep. 30, 2016

(86) PCT No.: PCT/US2016/054864
§ 371 (c)(1),
(2) Date: Feb. 28, 2019

(87) PCT Pub. No.: WO2018/063355
PCT Pub. Date: Apr. 5, 2018

(65) Prior Publication Data
US 2021/0296040 A1    Sep. 23, 2021

(51) Int. Cl.
*H01F 10/32*        (2006.01)
*H01L 43/02*        (2006.01)
(Continued)

(52) U.S. Cl.
CPC ........ *H01F 10/3286* (2013.01); *G11C 11/161* (2013.01); *H01L 43/02* (2013.01);
(Continued)

(58) Field of Classification Search
CPC ..... H01F 10/3286; H01L 43/02; H01L 43/08; H01L 43/10; H01L 43/12; G11C 11/161
(Continued)

(56) References Cited

U.S. PATENT DOCUMENTS 7,242,047 B2 * 7/2007 Mori ...................... B82Y 25/00
                                                        257/295
7,538,402 B2 * 5/2009 Fukumoto .............. B82Y 25/00
                                                        257/421
(Continued)

OTHER PUBLICATIONS

International Search Report and Written Opinion issued in PCT/US2016/054864, dated Apr. 25, 2017, 11 pages.
(Continued)

*Primary Examiner* — Tu-Tu V Ho
(74) *Attorney, Agent, or Firm* — Schwabe, Williamson & Wyatt, P.C.

(57) ABSTRACT

A perpendicular spin transfer torque memory (pSTTM) device incorporates a magnetic tunnel junction (MTJ) device having a free magnetic stack that includes a plurality of magnetic layers interleaved with a plurality of non-magnetic insert layers. The layers are arranged such that the topmost and bottommost layers are magnetic layers. The stacked design decreases the damping of the MTJ free magnetic stack, beneficially reducing the write current required to write to the pSTTM device. The stacked design further increases the interface anisotropy, thereby beneficially improving the stability of the pSTTM device. The non-magnetic interface layer may include tantalum, molybdenum, tungsten, hafnium, or iridium, or a binary alloy containing at least two of tantalum, molybdenum, tungsten hafnium, or iridium.

25 Claims, 7 Drawing Sheets

(51) Int. Cl.
*G11C 11/16* (2006.01)
*H01L 43/08* (2006.01)
*H01L 43/10* (2006.01)
*H01L 43/12* (2006.01)

(52) U.S. Cl.
CPC .............. *H01L 43/08* (2013.01); *H01L 43/10* (2013.01); *H01L 43/12* (2013.01)

(58) Field of Classification Search
USPC ........................................................ 257/421
See application file for complete search history.

(56) References Cited

U.S. PATENT DOCUMENTS

| 2006/0038213 | A1 | 2/2006 | Mori et al. | |
| 2006/0180839 | A1 | 8/2006 | Fukumoto et al. | |
| 2006/0262594 | A1* | 11/2006 | Fukumoto | H01F 10/3272 |
| | | | | 365/158 |
| 2014/0015078 | A1 | 1/2014 | Huai et al. | |
| 2014/0218821 | A1 | 8/2014 | Lu et al. | |

OTHER PUBLICATIONS

International Preliminary Report on Patentability issued in PCT/US2016/054864, dated Apr. 11, 2019, 10 pages.

\* cited by examiner

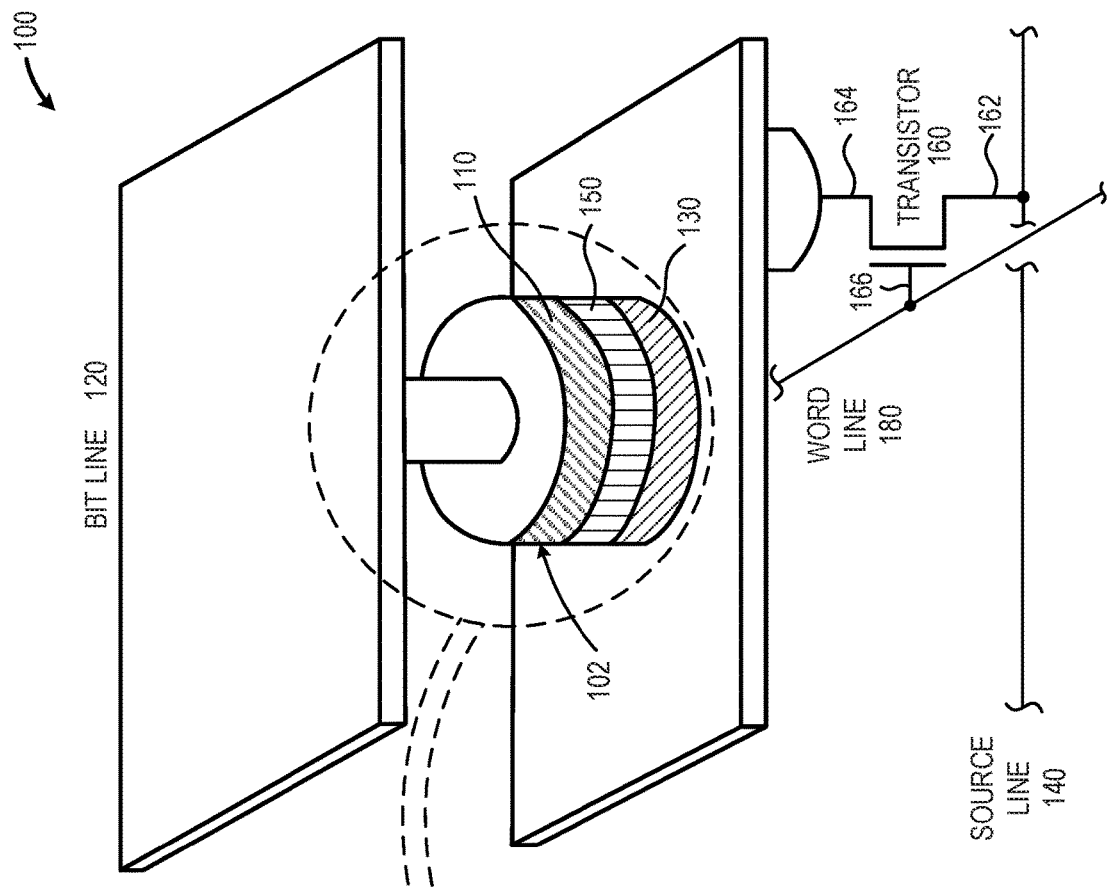
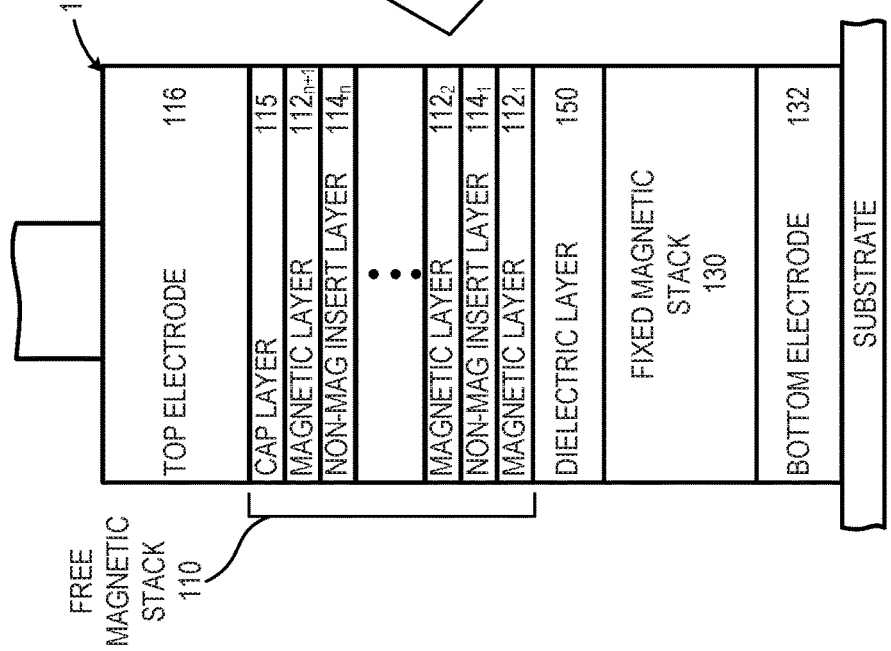
FIG. 1A
FIG. 1B

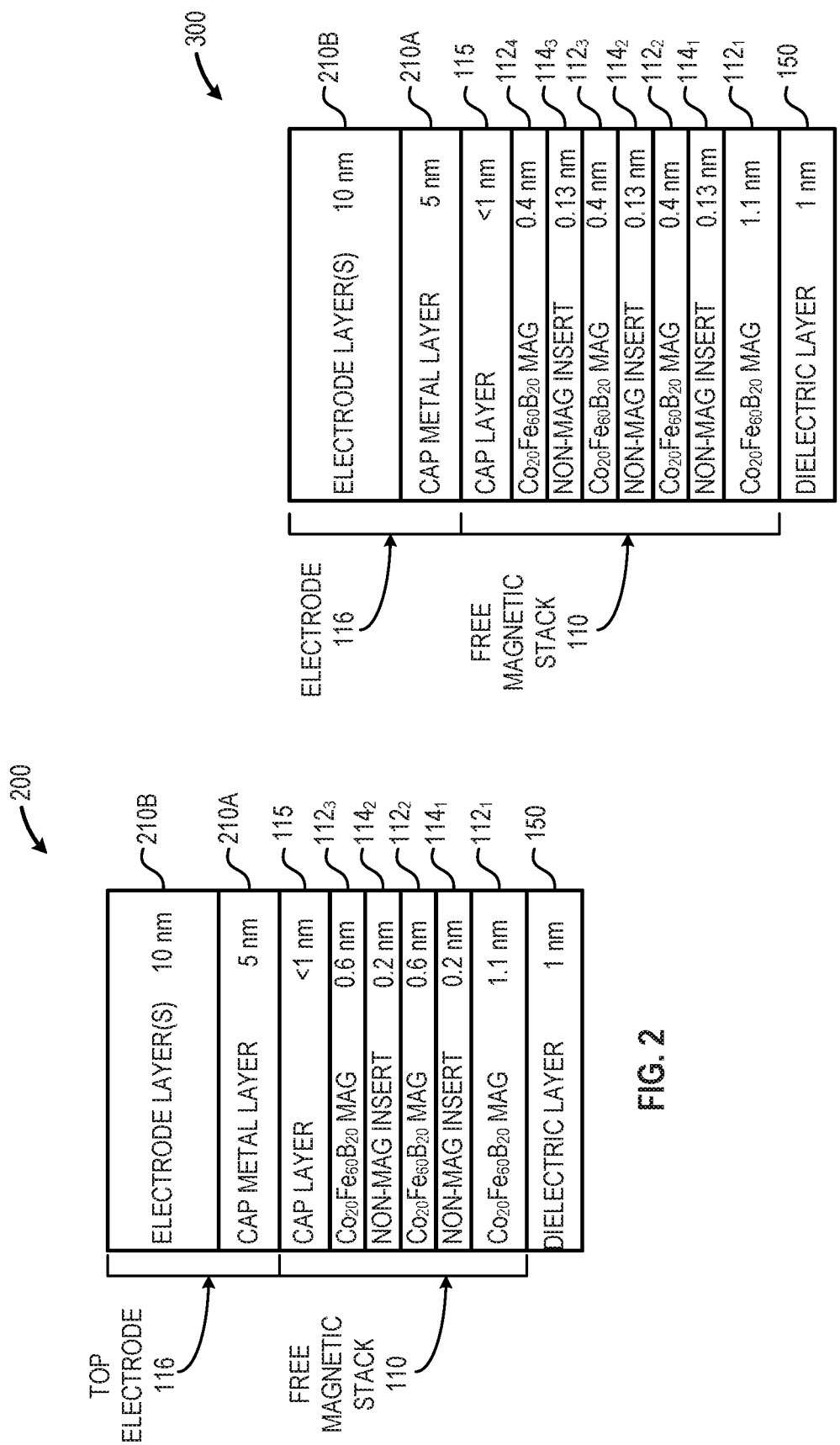

PERPENDICULAR STTM MULTI-LAYER INSERT FREE LAYER

CROSS-REFERENCE TO RELATED APPLICATIONS

This present application is a National Phase Application Filed Under 35 U.S.C. 371 claiming priority to PCT/US2016/054864 filed Sep. 30, 2016, the entire disclosure of which is incorporated herein by reference.

TECHNICAL FIELD

The present disclosure relates to perpendicular spin transfer torque memory (pSTTM).

BACKGROUND

Magnetoresistive random access memory (MRAM) is an evolving area of storage devices in which data is not stored as an electric charge or current flow, but instead in the form of magnetic storage elements. In MRAM elements are formed using two magnetic elements separated by a dielectric layer, a magnetic tunnel junction (MTJ). The MTJ includes a fixed (pinned) magnetic element set to a particular polarity and a free magnetic element having a switchable magnetic field that may be changed between two binary states by passage of a current through the MTJ. A memory device may be formed using a number of these individual, MTJ-based storage "cells." Spin transfer torque (STT) uses a current formed from spin-aligned or polarized electrons to develop a torque that is transferred to the free magnetic element to change the magnetic state of the free magnetic element.

BRIEF DESCRIPTION OF THE DRAWINGS

Features and advantages of various embodiments of the claimed subject matter will become apparent as the following Detailed Description proceeds, and upon reference to the Drawings, wherein like numerals designate like parts, and in which:

FIG. 1A is a perspective view of an illustrative perpendicular spin transfer torque memory (pSTTM) device incorporating a magnetic tunnel junction (MTJ) element that includes a free magnetic stack formed by interleaving a plurality of non-magnetic insert layers with a plurality of magnetic layers, in accordance with at least one embodiment described herein;

FIG. 1B is a partial cross-sectional view of the illustrative MTJ element shown in FIG. 1A that more clearly depicts the plurality of magnetic layers interleaved with the plurality of non-magnetic insert layers in the free magnetic layer, in accordance with at least one embodiment described herein;

FIG. 2 provides a cross-sectional view of an illustrative free magnetic stack 110 that includes three (3) magnetic layers and two (2) non-magnetic insert layers, in accordance with at least one embodiment described herein;

FIG. 3 provides a cross-sectional view of an illustrative free magnetic stack that includes four (4) magnetic layers and three (3) non-magnetic insert layers, in accordance with at least one embodiment described herein;

Figure 4:
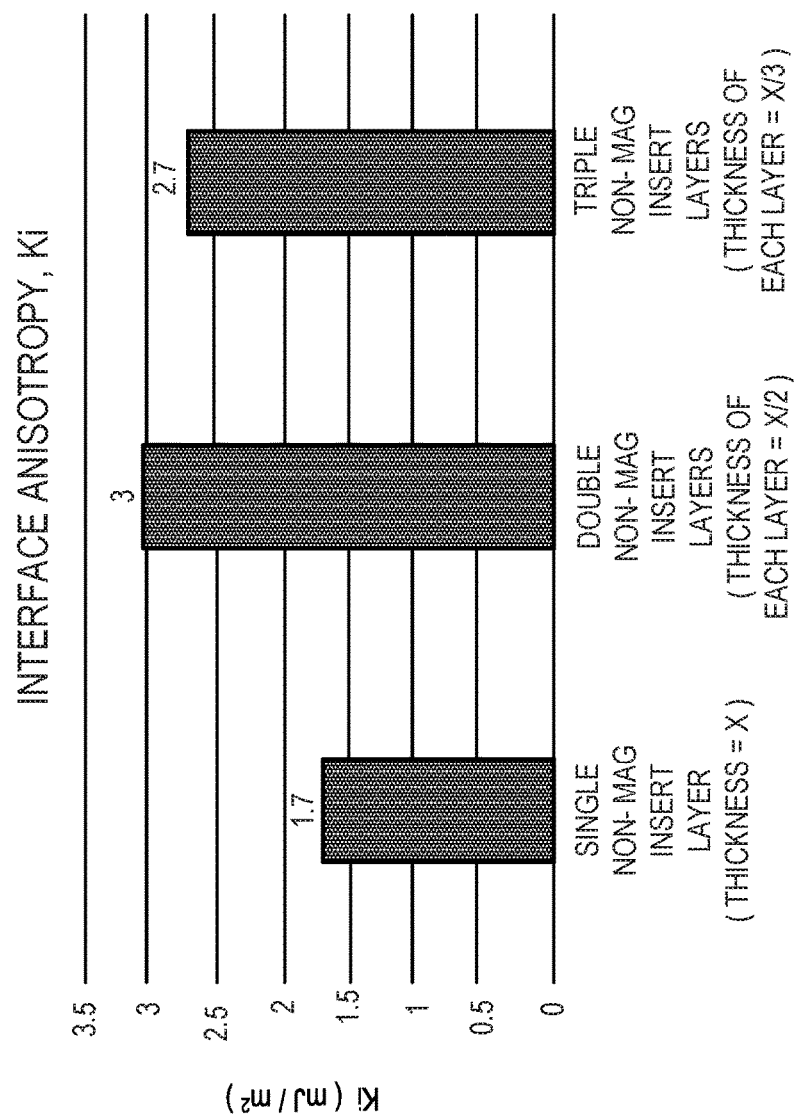
FIG. 4 provides a chart comparing the interface anisotropy (in milli-Joules per square meter, $mJ/m^2$) for three different illustrative free magnetic stack constructs each having a similar total non-magnetic insert layer thickness, a single non-magnetic insert layer; a double layer non-magnetic insert layer having two non-magnetic insert layers, each about one-half the thickness of the single non-magnetic insert layer; and a triple layer non-magnetic insert layer, each about one-third the thickness of the single non-magnetic insert layer, in accordance with at least one embodiment described herein.

Although the following Detailed Description will proceed with reference being made to illustrative embodiments, many alternatives, modifications and variations thereof will be apparent to those skilled in the art.

DETAILED DESCRIPTION

The magnetic tunnel junction (MTJ) stack used in perpendicular spin transfer torque memory (pSTTM) uses a free magnetic stack that includes a non-magnetic insert layer. The use of the non-magnetic insert layer in the free magnetic stack enhances tunnel magnetoresistance (TMR) and improves the stability of the free magnetic stack but increases damping values which increase the switching current of the pSTTM device. The systems and methods disclosed herein beneficially reduce damping while increasing the stability of the free layer by interleaving multiple non-magnetic insert layers between magnetic layers within the free magnetic layer. This interleaving has been found to improve cell stability while reducing cell switching current.

A magnetic tunnel junction (MTJ) free magnetic stack is provided. The MTJ free magnetic stack may include a plurality of non-magnetic insert layers; and a plurality of magnetic layer interleaved with the plurality of non-magnetic insert layers arranged such that a magnetic layer is disposed at the top of the MTJ free magnetic stack and a magnetic layer is disposed proximate the bottom of the MTJ free magnetic stack.

A perpendicular spin transfer torque memory (pSTTM) device that includes a magnetic tunnel junction (MTJ) storage device is provided. The pSTTM device may include a solid-state switching device that includes: a source coupled to a source line; a gate coupled to a word line; and a drain. Wherein the MTJ storage device includes: a first electrode coupled to the solid-state switching device drain; a second electrode coupled to a bit line; a fixed magnetic layer stack coupled to the first electrode; a dielectric layer coupled to the fixed magnetic layer stack, opposite the first electrode; and a free magnetic stack coupled to the second electrode, the free magnetic stack including: a plurality of non-magnetic insert layers; and a plurality of magnetic layer interleaved with the plurality of non-magnetic insert layers arranged such that a magnetic layer is disposed at the top of the MTJ free magnetic stack and a magnetic layer is disposed proximate the bottom of the MTJ free magnetic stack.

An MTJ free magnetic stack manufacturing method is provided. The method may include depositing a plurality of non-magnetic insert layers interleaved with a plurality of magnetic layers such that a magnetic layer is disposed at the top of the MTJ free magnetic stack and a magnetic layer is disposed proximate the bottom of the MTJ free magnetic stack.

A perpendicular spin transfer torque memory (pSTTM) data storage method is provided. The storage method may include selectively passing a write current through a magnetic tunnel junction (MTJ) device that includes an MTJ free magnetic stack to store digital data by altering the magnetic spin orientation of the MTJ free magnetic stack between an upward direction and a downward direction, the MTJ free magnetic stack including: a plurality of non-magnetic insert layers; and a plurality of magnetic layers interleaved with the plurality of non-magnetic insert layers, arranged such that a magnetic layer is disposed at the top of the MTJ free magnetic stack and a magnetic layer is disposed proximate the bottom of the MTJ free magnetic stack.

An MTJ free magnetic stack manufacturing system is provided. The system may include a means for depositing a plurality of non-magnetic insert layers interleaved with a plurality of magnetic layers such that a magnetic layer is disposed at the top of the MTJ free magnetic stack and a magnetic layer is disposed proximate the bottom of the MTJ free magnetic stack.

As used herein the terms "top," "bottom," "upper," "uppermost," "lower," and "lowermost" when used in relationship to one or more elements are intended to convey a relative rather than absolute physical configuration. Thus, an element described as a "top element" in a device may instead form the "bottom element" in the device when the device is inverted. Similarly, an element described as the "bottom element" in the device may instead form the "top element" in the device when the device is inverted.

FIG. 1A provides a perspective view of an illustrative perpendicular spin transfer torque memory (pSTTM) cell 100 incorporating a magnetic tunnel junction (MTJ) element 102 that includes a free magnetic stack 110 formed by interleaving a plurality of non-magnetic insert layers with a plurality of magnetic layers, in accordance with at least one embodiment described herein. FIG. 1B provides a partial cross-sectional view of the illustrative MTJ element 102 depicted in FIG. 1A more clearly depicting the free magnetic stack 110 that includes the plurality of magnetic layers $112_1$-$112_{n+1}$ (collectively "magnetic layers 112") interleaved with the plurality of non-magnetic insert layers $114_1$-$114_n$ (collectively "non-magnetic insert layers 114"), in accordance with at least one embodiment described herein.

As depicted in FIG. 1A, the MTJ device 102 includes a free magnetic stack 110 and a fixed magnetic layer 130 separated by a barrier or dielectric layer 150. The free magnetic stack 110 of the MTJ device 102 conductively couples to a bit line 120. The fixed magnetic layer 130 of the MTJ device 102 conductively couples to a drain 164 of a solid state switching device, such as a transistor 160. The source 162 of the transistor 160 conductively couples to a source line 140. The gate 166 of the transistor 160 conductively couples to a word line 180. Thus, the word line 180 controls the operation of the transistor 160 and the potential difference between the bit line 120 and the source line 140 determines the direction current flows through the MTJ device 102.

As depicted in FIG. 1B, the free magnetic stack 110 includes a plurality of non-magnetic insert layers $114_1$-$114_n$ interleaved with and between a plurality of magnetic layers $112_1$-$112_{n+1}$ such that the stack forming the free magnetic stack 110 includes a bottom magnetic layer $112_1$ and a top magnetic layer $112_{n+1}$. The interleaved non-magnetic layers 114 and magnetic layers 112 are disposed between the dielectric layer 150 and a cap layer 115. A top electrode 116 is disposed proximate the cap layer 115 opposite the top magnetic layer $112_{n+1}$. Interleaving the non-magnetic insert layers 114 with the magnetic layers 112 has been found to beneficially increase the interfacial anisotropy (Ki), thereby increasing the stability of the MTJ device 102 as a memory device. Interleaving the non-magnetic insert layers 114 with the magnetic layers 112 has also been found to beneficially reduce damping of the free magnetic layer, thereby reducing the current required to write a memory state (UP/DOWN) to the MTJ device 102.

The magnetic layers 112 may include any number and/or combination of magnetic materials capable of selectively producing an UP or a DOWN magnetic field responsive to the passage of a write current through the MTJ device 102. Each of the magnetic layers 112 may be deposited, patterned, or otherwise formed using any currently available or future developed deposition technology and/or techniques, such as physical vapor deposition (PVD), photolithography, electroplating, electro-less plating, sputtering, or similar. In some implementations, some or all of the magnetic layers 112 include a magnetic material containing cobalt (Co), iron (Fe), and boron (B). In some specific implementations, some or all of the magnetic layers 112 may include a magnetic material such as $Co_{20}Fe_{60}B_{20}$. Each of the magnetic layers 112 included in the free magnetic stack 110 may have the same or a different thickness. Each of the magnetic layers 112 included in the free magnetic stack 110 may have a thickness of: about 0.2 nanometers (nm) to about 1.7 nm; about 0.2 nm to about 1.5 nm; about 0.2 nm to about 1.2 nm; or about 0.2 nm to about 1 nm. The sum of the thicknesses of the individual magnetic layers $112_1$-$112_{n+1}$ may be: about 1 nanometer (nm) to about 7 nm; about 2 nm to about 7 nm; about 3 nm to about 7 nm; about 4 nm to about 7 nm; or about 5 nm to about 7 nm.

The non-magnetic insert layers 114 may each include the same or a different number and/or combination of materials. In embodiments, some or all of the materials included each of the non-magnetic insert layers 114 may include one or more non-magnetic materials. Advantageously, each of a plurality of non-magnetic insert layers 114 may be interleaved with and/or between each of the plurality of magnetic layers 112 to provide at least a portion of the free magnetic stack 110. In general, where a plurality of "n" (where n is whole number greater than or equal to 2) non-magnetic insert layers 114 are used, "n+1" magnetic layers 112 are interleaved to provide at least a portion of the free magnetic stack 110. Such an arrangement provides a magnetic layer $112_1$ as the lowermost layer and a magnetic layer $112_{n+1}$ as the uppermost layer, with the non-magnetic insert layers 114 interleaved with magnetic layers $112_2$-$112_n$ therebetween.

Each of the non-magnetic insert layers 114 may be deposited, patterned, or otherwise formed using any currently available or future developed deposition technology and/or techniques, such as physical vapor deposition (PVD), photolithography, electroplating, electro-less plating, sputtering, or similar. In some implementations, some or all of the non-magnetic insert layers 114 include one or more non-magnetic materials such as tantalum (Ta), molybdenum (Mo), hafnium, (Hf), tungsten (W) and iridium (Jr). In some implementations, some or all of the non-magnetic insert layers 114 include one or more binary alloys formed using two of tantalum, molybdenum, hafnium, tungsten, and iridium. In some implementations, some or all of the non-magnetic insert layers 114 include one or more binary alloys formed using two of tantalum, molybdenum, hafnium, tungsten, and iridium having a ratio of about 1:1 to about 1:3.

Each of the non-magnetic insert layers 114 included in the free magnetic stack 110 may have the same or a different thickness. Each of the non-magnetic insert layers 114 included in the free magnetic stack 110 may have a thickness of: about 0.05 nanometers (nm) to about 3 nm; about 0.1 nm to about 3 nm; or about 1.5 nm to about 3 nm. The sum of the thicknesses of the individual non-magnetic insert layers $114_1$-$114_n$ may be: about 0.1 nanometer (nm) to about 6 nm; about 0.15 nm to about 6 nm; about 2 nm to about 6 nm; about 2.5 nm to about 6 nm; or about 3 nm to about 6 nm. In implementations, the ratio of the thickness of a respective magnetic layer 112 to a respective non-magnetic insert layer 114 may be as low as 1:1 and may be as great as 8:1. The construction of the free magnetic stack 110 is beneficially compatible of standard complementary mixed oxide manufacturing techniques and is able to with stand temperatures of up to 400° C.

The cap layer 115 may be deposited, patterned, or otherwise formed using any currently available or future developed deposition technology and/or techniques, such as physical vapor deposition (PVD), photolithography, electroplating, electro-less plating, sputtering, or similar. The cap layer 115 may be formed using one or more oxides, such as oxides of: magnesium (MgO), aluminum ($AlO_x$), tantalum ($TaO_x$), gadolinium ($GdO_x$), hafnium ($HfO_x$), titanium ($TiO_x$), and/or tungsten ($WO_x$). In at least one implementation, the cap layer 115 may include magnesium oxide (MgO). The cap layer 115 has a thickness of less than about 1 nanometer (nm) and is formed, patterned, or otherwise disposed proximate at least a portion of the uppermost magnetic layer $112_3$.

In embodiments, a top electrode 116 is disposed proximate the cap layer 115 in the free magnetic stack 110. In some implementations, the top electrode 116 may include one or more materials disposed in a number of layers Example, non-limiting, electrode materials include: tantalum, ruthenium, platinum, titanium nitride, tantalum nitride, tungsten, molybdenum, and alloys containing these materials.

In embodiments, a bottom electrode 132 is disposed proximate the fixed magnetic layer 130. In some implementations, the bottom electrode 130 may include one or more materials disposed in any number of full or partial layers. Example, non-limiting, electrode materials include: tantalum, ruthenium, platinum, titanium nitride, tantalum nitride, tungsten, molybdenum, and alloys containing these materials.

In operation, the passage of a write current through the pSTTM device 100 sets the memory state of the device to a binary value of "0" or "1" based on the direction of the magnetic field within the free magnetic layer. Damping is a measure of the "difficulty" of transitioning the magnetic field in the free magnetic stack 110 and consequently a measure of the write current required for the pSTTM device 100 to operate as a binary data storage device (greater damping=greater write current; conversely, reduced damping=reduced write current). Interfacial anisotropy within the free magnetic stack 110 provides a measure of the stability or data retention time of the pSTTM device 100. The stability of the pSTTM device 100 improves with increasing interfacial anisotropy and decreases with decreasing interfacial anisotropy. The systems and methods described herein beneficially decreases the damping of the free magnetic stack 110 and increases the interfacial anisotropy within the pSTTM device 100, thereby reducing the needed write current and increasing the data stability within the pSTTM device 100.

The resistance of the pSTTM device 100 changes based on the orientation of the magnetic field in the free magnetic stack 110. Thus, the binary data stored in the pSTTM device 100 may be read by passing a read current through the device and measuring the resistance of the pSTTM device 100.

FIG. 2 provides a cross-sectional view of an illustrative free magnetic stack 110 that includes three (3) magnetic layers $112_1$-$112_3$ and two (2) non-magnetic insert layers $114_1$-$114_2$, in accordance with at least one embodiment described herein. As depicted in FIG. 2, the free magnetic stack 110 include a cap layer 115 that may be formed at least in part using magnesium oxide (MgO), may have a thickness of less than about 1 nanometer (nm), and may be disposed proximate the uppermost magnetic layer $112_3$. As depicted in FIG. 2, the free magnetic stack 110 includes a dielectric layer 150 that may be formed using magnesium oxide (MgO), may have a thickness of about 1 nm, and may be disposed proximate the bottommost magnetic layer $112_1$. As depicted in FIG. 2, the top electrode 116 may include a cap metal layer 210A that is formed, patterned, or otherwise disposed on, about, or across at least a portion of the cap layer 115. In at least one embodiment, the cap metal layer 210A may be formed using tantalum (Ta), and may have having a thickness of about 5 nanometers (nm). Also as depicted in FIG. 2, the top electrode 116 may include a number of additional electrode layer(s) 210B. In at least one embodiment, the top electrode 116 may include at least one additional layer 210B may be formed, patterned, otherwise disposed on, about or across all or a portion of the cap metal layer 210A. In embodiments, the at least one additional layer may include ruthenium (Ru) having a thickness of about 10 nanometers (nm).

The dielectric layer 150 may be deposited, patterned, or otherwise formed using any currently available or future developed deposition technology and/or techniques, such as physical vapor deposition (PVD), photolithography, electroplating, electro-less plating, sputtering, or similar. The dielectric layer 150 may be formed using one or more oxides, such as oxides of: magnesium (MgO), aluminum ($AlO_x$), tantalum ($TaO_x$), gadolinium ($GdO_x$), hafnium ($HfO_x$), titanium ($TiO_x$), and/or tungsten ($WO_x$). In at least one implementation, the filter layer 220 may include magnesium oxide (MgO). The dielectric layer 150 has a thickness of less about 1 nanometer (nm) and is formed, patterned, or otherwise disposed proximate at least a portion of the lowermost magnetic layer $112_1$.

In the illustrative embodiment depicted in FIG. 2, the free magnetic stack 110 includes illustrative or example magnetic layers 112 formed using CoFeB. In embodiments, one or more magnetic materials, such as CoFeNiB or NiFeB, may be used as an alternative or in addition to CoFeB. A first magnetic layer $112_1$ has a thickness of 1.1 nanometers (nm), a second magnetic layer $112_2$ has a thickness of 0.6 nm, and a third magnetic layer $112_3$ has a thickness of 0.6 nm. The total thickness of the magnetic layers 112 within the free magnetic stack 110 is 2.3 nm.

Also in the illustrative embodiment depicted in FIG. 2, the free magnetic stack 110 includes a first non-magnetic insert layer $114_1$ having a thickness of 0.2 nm disposed/interleaved between the first magnetic layer $112_1$ and the second magnetic layer $112_2$. The free magnetic stack 110 also includes a second non-magnetic insert layer $114_2$ having a thickness of 0.2 nm disposed/interleaved between the second magnetic layer $112_2$ and the third magnetic layer $112_3$. The total thickness of the non-magnetic insert layers 114 within the free magnetic stack 110 is 0.4 nm.

FIG. 3 provides a cross-sectional view of an illustrative free magnetic stack 110 that includes four (4) magnetic layers $112_1$-$112_4$ and three (3) non-magnetic insert layers $114_1$-$114_3$, in accordance with at least one embodiment described herein. As depicted in FIG. 3, the free magnetic stack 110 include a cap layer 115 that, in some implementations, may be formed using magnesium oxide (MgO), may have a thickness of less than about 1 nanometer (nm), and may be disposed, patterned, or otherwise formed on, about, or across all or a portion of the uppermost magnetic layer $112_4$. Also as depicted in FIG. 2, the free magnetic stack 110 includes a dielectric layer 150 that, in some implementations, may be formed using magnesium oxide, may have a thickness of about 1 nm, and may be disposed, patterned, or otherwise formed on, about, or across all or a portion of the bottommost magnetic layer $112_1$.

As depicted in FIG. 3, the top electrode 116 may include a cap metal layer 210A that is disposed, patterned, or otherwise formed on, about, or across all or a portion of the cap layer 115. In some implementations, the cap metal layer 210A may include tantalum (Ta) and may have a thickness of about 5 nanometers (nm). The top electrode 116 may include a and a second layer 210B that includes ruthenium (Ru) having a thickness of about 10 nanometers (nm).

In the illustrative embodiment depicted in FIG. 3, the free magnetic stack 110 includes a first magnetic layer $112_1$ formed using CoFeB and having a thickness of 1.1 nanometers (nm), a second magnetic layer $112_2$ formed using a CoFeB and having a thickness of 0.4 nm, a third magnetic layer $112_3$ formed using a CoFeB and having a thickness of 0.4 nm, and a fourth magnetic layer $112_4$ formed using a CoFeB and having a thickness of 0.4 nm. The total thickness of the magnetic layers 112 within the free magnetic stack 110 is 2.3 nm.

In the illustrative embodiments depicted in FIGS. 2 and 3, the overall thickness of the magnetic layers 112 within the free magnetic stack 110 remained constant at 2.3 nm regardless of the number of magnetic layers 112 included in the free magnetic stack 110. In FIG. 2, three magnetic layers $112_1$, $112_2$, and $112_3$ had thicknesses of 1.1 nm, 0.6 nm, and 0.6 nm, respectively, for a total thickness of 2.3 nm. In FIG. 3, four magnetic layers $112_1$, $112_2$, $112_3$, and $112_4$ had thicknesses of 1.1 nm, 0.4 nm, 0.4 nm, and 0.4 nm, respectively, for a total thickness of 2.3 nm.

Also in the illustrative embodiment depicted in FIG. 3, the free magnetic stack 110 includes a first non-magnetic insert layer $114_1$ having a thickness of 0.13 nm disposed/interleaved between the first magnetic layer $112_1$ and the second magnetic layer $112_2$, a second non-magnetic insert layer $114_2$ having a thickness of 0.13 nm disposed/interleaved between the second magnetic layer $112_2$ and the third magnetic layer $112_3$, and a third non-magnetic insert layer $114_3$ having a thickness of 0.13 nm disposed/interleaved between the third magnetic layer $112_3$ and the fourth magnetic layer $112_4$. The total thickness of the non-magnetic insert layers 114 within the free magnetic stack 110 is about 0.4 nm.

In the illustrative embodiments depicted in FIGS. 2 and 3, the overall thickness of the non-magnetic insert layers 114 within the free magnetic stack 110 remained constant at 0.4 nm regardless of the number of non-magnetic insert layers 114 included in the free magnetic stack 110. In FIG. 2, two non-magnetic insert layers $114_1$ and $114_2$ had thicknesses of 0.2 nm and 0.2 nm, respectively, for a total thickness of 0.4 nm. In FIG. 3, three non-magnetic insert layers $114_1$, $114_2$, and $114_3$ had thicknesses of 0.13 nm, 0.13 nm, and 0.13 nm, respectively, for a total thickness of 0.39 nm.

FIG. 4 provides a chart 400 comparing the interface anisotropy (in milli-Joules per square meter, $mJ/m^2$) for three different illustrative free magnetic stack 110 constructs each having a similar total non-magnetic insert layer 114 thickness, a single non-magnetic insert layer 114; a double layer non-magnetic insert layer 114 having two non-magnetic insert layers 114, each about one-half the thickness of the single non-magnetic insert layer 114; and a triple layer non-magnetic insert layer 114, each about one-third the thickness of the single non-magnetic insert layer 114, in accordance with at least one embodiment described herein. Interface anisotropy is a measure of the stability of the pSTTM device 100. Increasing interface anisotropy generally results in increased stability for the pSTTM device 100. Conversely, decreasing interface anisotropy generally results in decreased stability for the pSTTM device 100.

As depicted in FIG. 4, the value of the interface anisotropy of the free magnetic stack 110 containing double non-magnetic insert layers 114 (3 $mJ/m^2$) improves (i.e., increases) by about 75% over the value of the interface anisotropy (1.7 $mJ/m^2$) for the free magnetic stack containing only a single non-magnetic insert layer 114. Additionally, the value of the interface anisotropy of the free magnetic stack 110 containing triple non-magnetic insert layers 114 (2.7 $mJ/m^2$) improves (i.e., increases) by about 60% over the value of the interface anisotropy (1.7 $mJ/m^2$) for the free magnetic stack containing only a single non-magnetic insert layer 114. These improvements in interface anisotropy are achieved without increasing the total thickness of the non-magnetic insert layers 114, but instead by apportioning the overall thickness of the non-magnetic insert layers 114 into a plurality of non-magnetic insert layers 114 that are interleaved with a plurality of magnetic layers 112.

Figure 5:
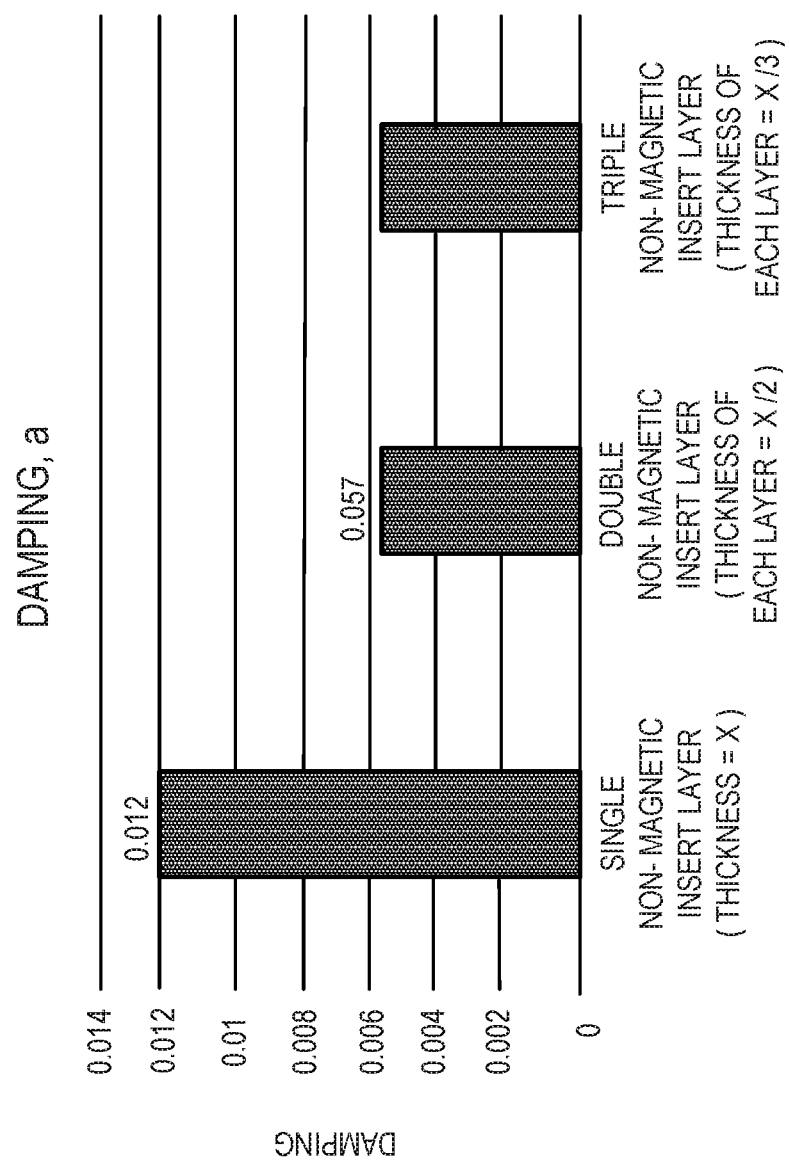
FIG. 5 provides a chart comparing the damping for three different illustrative free magnetic stack constructs each having a similar total non-magnetic insert layer thickness, a single non-magnetic insert layer; a double layer non-magnetic insert layer having two non-magnetic insert layers, each about one-half the thickness of the single non-magnetic insert layer—such as depicted in FIG. 2; and a triple layer non-magnetic insert layer, each about one-third the thickness of the single non-magnetic insert layer—such as depicted in FIG. 3, in accordance with at least one embodiment described herein.

FIG. 5 provides a chart 500 comparing the damping for three different illustrative free magnetic stack 110 constructs each having a similar total non-magnetic insert layer 114 thickness, a single non-magnetic insert layer 114; a double layer non-magnetic insert layer 114 having two non-magnetic insert layers 114, each about one-half the thickness of the single non-magnetic insert layer 114—such as depicted in FIG. 2; and a triple layer non-magnetic insert layer 114, each about one-third the thickness of the single non-magnetic insert layer 114—such as depicted in FIG. 3, in accordance with at least one embodiment described herein. Damping is a measure of the write current required to change the binary memory state of the pSTTM device 100. Increasing damping generally results in an increased write current to change the binary memory state of the pSTTM device 100. Conversely, decreasing damping generally results in decreased write current to change the binary memory state of the pSTTM device 100.

As depicted in FIG. 5, the value of the damping (0.0057) of the free magnetic stack 110 containing two non-magnetic insert layers 114 improves (i.e., decreases) by about 50% over the value of the damping for the free magnetic stack containing only a single non-magnetic insert layer 114 (0.012). Additionally, the value of the damping of the free magnetic stack 110 containing three non-magnetic insert layers 114 (0.0057) also improves (i.e., decreases) by about 50% over the value of the damping for the free magnetic stack containing only a single non-magnetic insert layer 114 (0.012). Advantageously, these improvements in damping are achieved without increasing the total thickness of the non-magnetic insert layers 114, but instead by apportioning the overall thickness of the non-magnetic insert layers 114 into a plurality of non-magnetic insert layers 114 that are interleaved with a plurality of magnetic layers 112.

Figure 6:
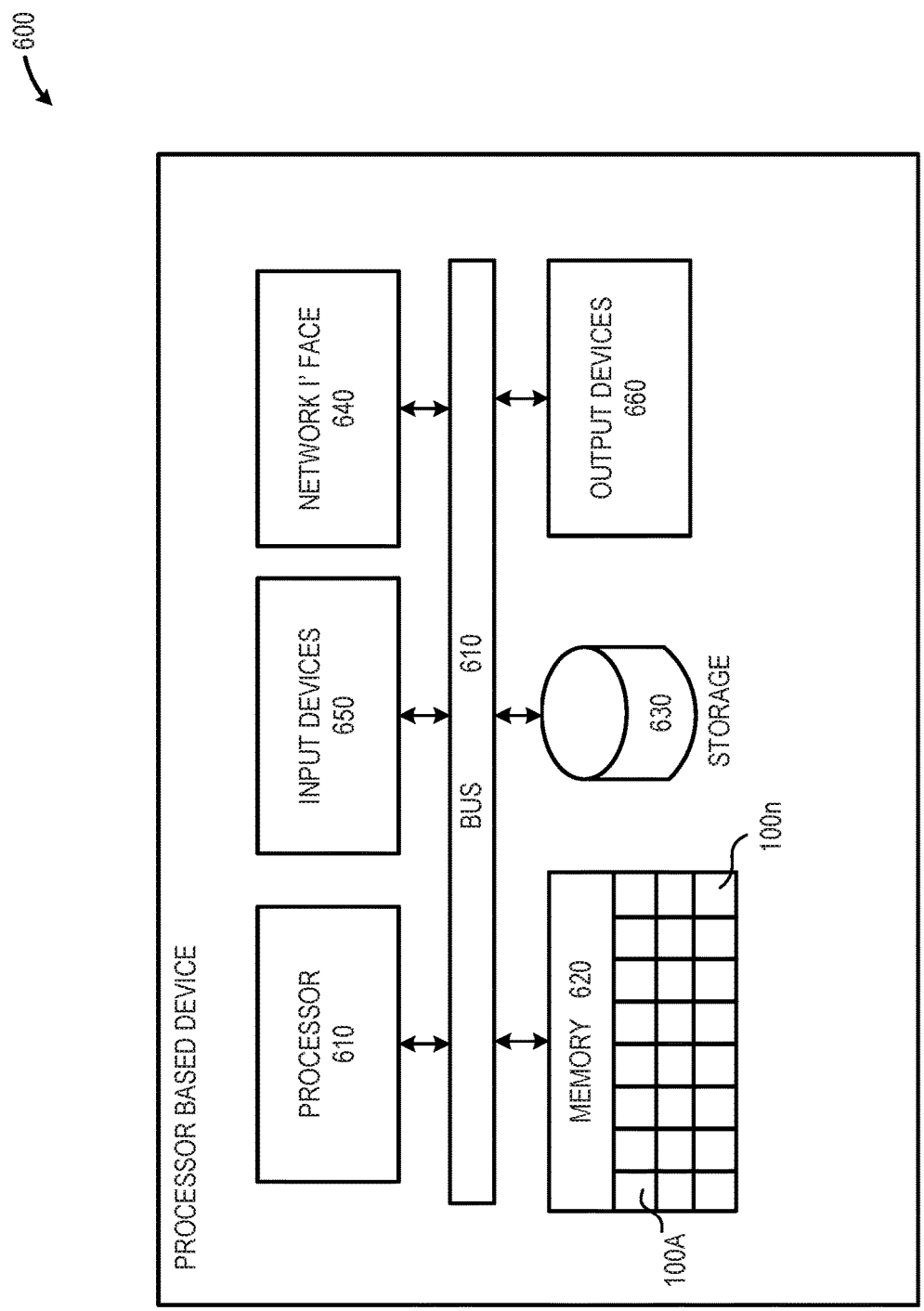
FIG. 6 provides a block diagram of an illustrative processor-based device that includes a memory formed by a number of pSTTM devices, in accordance with at least one embodiment described herein.

FIG. 6 provides a block diagram of an illustrative processor-based device 600 that includes a memory 620 formed by a number of pSTTM devices 100A-100n (collectively, "pSTTM devices 100"), in accordance with at least one embodiment described herein. The processor-based device 600 may include any currently available and/or future developed device or system that includes a memory such as a random access memory (RAM) capable of using pSTTM devices 100 to provide at least a portion of the RAM. Illustrative, non-limiting examples of such devices may include: desktop computers, servers, Internet-of-Things devices, laptop computers, wearable computers, handheld computers, smartphones, personal digital assistants, vehicle controllers, equipment controllers, workstations, and the like.

The processor-based device 600 includes a processor 610, memory 620, non-transitory data storage 630, one or more wired or wireless network interfaces 640, one or more wired or wireless input devices 650, and/or one or more wired or wireless output devices 660. The processor 610 may include various hardwired, configurable, and/or reconfigurable circuits or circuitry. Such circuitry may be implemented in the form of hardwired circuits, programmable circuits, controllers, signal processors, processors, microprocessors, programmable gate arrays, or combinations thereof.

The processor 610 in each of the peer devices 110 may include a variety of electronic and/or semiconductor components that are disposed partially or wholly in a wearable computer, portable computing device, personal digital assistant, personal computer, or other similar currently available or future developed processor-based device and/or system capable of executing machine-readable instructions. The processor 610 is operably and/or communicably coupled to various components within the processor-based device 600 via one or more buses 670. As depicted in FIG. 6, the bus 670 communicably couples various system components, such the memory 620 containing the pSTTM devices 100, to the processor 610. The bus 670 interconnecting at least some of the components in the processor-based device 600 may employ any currently available and/or future developed serial or parallel bus structures or architectures.

The processor 610 may include, but is not limited to any current or future developed single- or multi-core processor or microprocessor, such as: one or more systems on a chip (SOCs); one or more central processing units (CPUs); one or more digital signal processors (DSPs); one or more graphics processing units (GPUs); one or more application-specific integrated circuits (ASICs), one or more field programmable gate arrays (FPGAs), and the like. Unless described otherwise, the construction and operation of the various blocks illustrated in FIG. 6 are of conventional design. As a result, such blocks need not be described in further detail herein, as they are readily understood by those skilled in the relevant art.

The memory 620 includes random access memory, at least a portion of which includes pSTTM devices 100A-100n. A non-volatile portion of the memory 620 includes a basic input/output system ("BIOS"). The BIOS provides basic functionality for the processor-based device 600, for example by causing the processor 610 to load one or more machine-readable instruction sets that cause the processor-based device 600 to perform one or more functions.

The processor-based device 600 includes a communicably coupled, non-transitory, data storage device 630. The non-transitory, data storage device 630 may include any number and/or combination of any currently available and/or future developed non-transitory storage devices. Non-limiting examples of such non-transitory, data storage devices 630 may include, without limitation, one or more magnetic storage devices, one or more optical storage devices, one or more solid-state electromagnetic storage devices, one or more electroresistive storage devices, one or more molecular storage devices, one or more quantum storage devices, or various combinations thereof.

The processor-based device 600 also includes one or more network interfaces 640 that are able to communicably couple the processor-based device 600 to one or more external devices. Such network interfaces 640 may include one or more wired and/or wireless interfaces suitable for unidirectional or bidirectional communication with one or more external devices. In one example, one or more network interfaces 640 may enable the processor-based device 600 to retrieve data and/or information from one or more remote sources, such as one or more remote server based storage devices or "cloud" storage devices.

The processor-based device 600 includes one or more communicably coupled input devices 650 that permit a user of the processor-based device 600 to provide information and/or data to the processor-based device 600. Such input devices 650 may include, without limitation, one or more text entry devices (e.g., keyboard), one or more pointing devices (e.g., mouse, trackball, touchscreen), and/or one or more audio input devices. Such input devices 650 may be used, for example, to provide, enter, or otherwise supply commands (e.g., acknowledgements, selections, confirmations, and similar) as well as information (e.g., acknowledgements, corrected subject identifiers, and similar) processor 610.

The processor-based device 600 includes one or more communicably coupled output devices 660 that provide a user of the processor-based device 600 with information and/or data in the form of visible, audible, or tactile feedback. Such output devices 660 may include, without limitation, one or more visual output devices (e.g., a display device, LED display, LCD display, CRT display), one or more tactile output devices (e.g., haptic feedback or similar), one or more audio output devices, or any combination thereof.

For convenience, the processor 610, memory 620, non-volatile data storage e630, network interface 640, input devices 650, and output devices 660 are illustrated as communicatively coupled to each other via the bus 670, thereby providing connectivity between the above-described components. In alternative embodiments, the above-described components may be communicatively coupled in a different manner than illustrated in FIG. 6. For example, one or more of the above-described components may be directly coupled to other components, or may be coupled to each other, via one or more intermediary components (not shown). In some embodiments, the bus 670 may be omitted and the components are coupled directly to each other using suitable wired or wireless connections.

Figure 7:
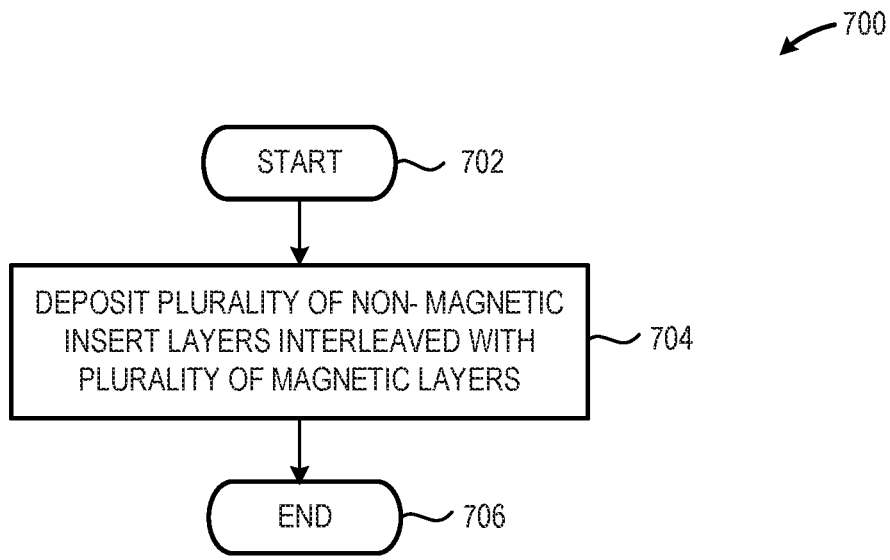
FIG. 7 provides a high-level logic flow diagram of an illustrative MTJ free magnetic stack manufacturing method that includes a plurality of magnetic layers interleaved with a plurality of non-magnetic insert layers such that a magnetic layer is on the bottom of the free magnetic stack and a magnetic layer is on the top of the free magnetic stack, in accordance with at least one embodiment described herein.

FIG. 7 provides a high-level logic flow diagram of an illustrative MTJ free magnetic stack manufacturing method 700 that includes a plurality of magnetic layers 112 interleaved with a plurality of non-magnetic insert layers 114 such that a magnetic layer $112_1$ is on the bottom of the free magnetic stack 110 and a magnetic layer $112_{n+1}$ is on the top of the free magnetic stack 110, in accordance with at least one embodiment described herein. Interleaving the magnetic layers 112 and the non-magnetic insert layers 114 beneficially increases the stability of the pSTTM device by increasing the damping of the MTJ and beneficially decreases write current required by the pSTTM device by decreasing the interface anisotropy. The method 700 commences at 702.

At 704, a plurality of magnetic layers 112 are interleaved with a plurality of non-magnetic insert layers 114. In embodiments, a plurality of magnetic layers $112_1$ to $112_{n+1}$ (where n is a whole number greater than or equal to 2) are interleaved with a plurality of non-magnetic insert layers $114_1$ to $114_n$. In such embodiments, the interleaving provides the magnetic layer $112_1$ on the bottom of the MTJ free magnetic stack 110 and the magnetic layer $112_{n+1}$ on the top of the MTJ free magnetic stack 110. A non-magnetic insert layer 114 is disposed between each adjacent pair of magnetic layers 112.

The magnetic layers 112 and the non-magnetic insert layers 114 may be deposited, patterned, or otherwise formed using any currently available and/or future developed patterning or deposition technique. Such techniques may include, but are not limited to, physical vapor deposition (PVD), photolithography, electroplating, electro-less plating, sputtering, or similar. In some implementations, the magnetic layers 112 may include a material containing cobalt, iron, and boron, such as $Co_{20}Fe_{60}B_{20}$. In such implementations, each of the magnetic layers 112 may have the same or different thicknesses that may range from about 0.2 nanometers (nm) to about 2 nm. In some implementations, the non-magnetic insert layers 114 may include tantalum, molybdenum, tungsten, or binary alloys containing tantalum, molybdenum, and tungsten. In such implementations, each of the non-magnetic insert layers 114 may have the same or different thicknesses that may range from about 0.1 nanometers (nm) to about 0.3 nm. The method 700 concludes at 706.

Figure 8:
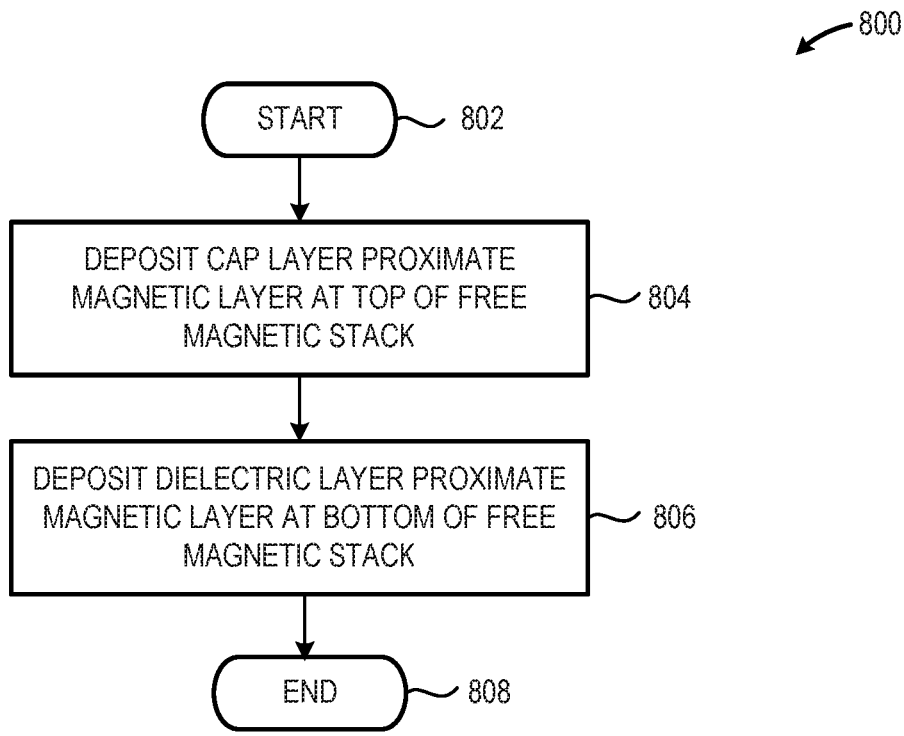
FIG. 8 provides a high-level logic flow diagram of an illustrative MTJ free magnetic stack manufacturing method 800 that includes deposition of a cap layer above and a dielectric layer below the MTJ free magnetic stack, in accordance with at least one embodiment described herein.

FIG. 8 provides a high-level logic flow diagram of an illustrative MTJ free magnetic stack manufacturing method 800 that includes forming a cap layer 115 above the uppermost magnetic layer $112_{n+1}$ in the free magnetic stack 110 and a dielectric layer 150 below the lowermost magnetic layer $112_1$ in the MTJ free magnetic stack 110, in accordance with at least one embodiment described herein. The method 800 commences at 802.

At 804, a cap layer 115 may be deposited, patterned, or otherwise formed proximate the top magnetic layer $112_{n+1}$ using any currently available and/or future developed patterning or deposition technique. In some implementations, this cap layer 115 may provide an interface between the free magnetic stack 110 and the top electrode 116. In at least some implementations, the cap layer 115 may be formed, all or in part, using magnesium oxide (MgO) and may have a thickness of less than 1 nanometer (nm).

At 806, a dielectric layer 150 may be may be deposited, patterned, or otherwise formed on, about, or across all or a portion of the bottom magnetic layer $112_1$ using any currently available and/or future developed patterning or deposition technique. In some implementations, the dielectric layer 150 may be deposited, patterned, or otherwise formed on, about, or across all or a portion of the upper surface of the fixed magnetic layer 130 prior to depositing, patterning, or otherwise forming the bottom magnetic layer $112_1$. In such implementations, the bottom magnetic layer $112_1$ may then be deposited, patterned, or otherwise formed on, about, or across at least a portion of the dielectric layer 220. In at least some implementations, the dielectric layer 150 may include, in whole or in part, a magnesium oxide (MgO) layer having a thickness of about 1 nanometer (nm). The method 800 concludes at 808.

Figure 9:
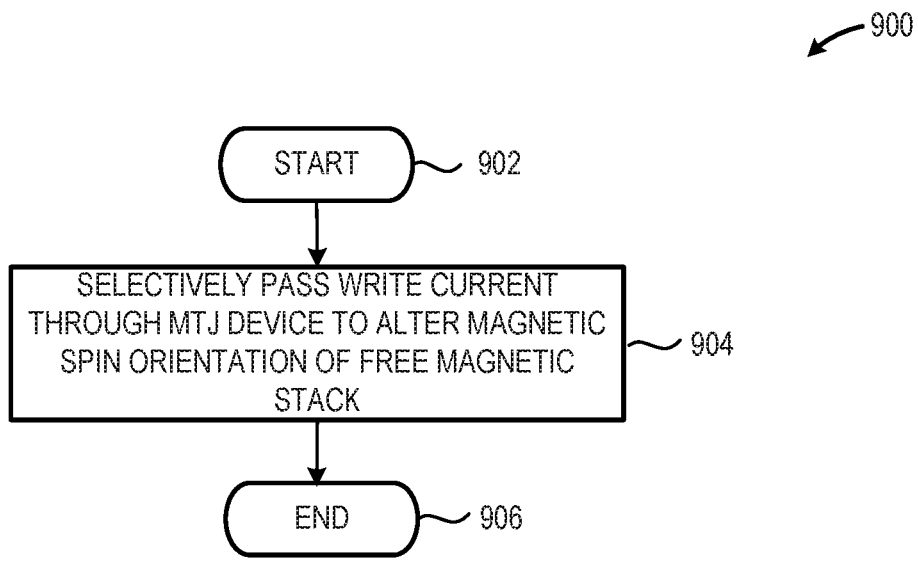
FIG. 9 provides a high-level logic flow diagram of an illustrative method of writing data to a pSTTM device by altering the direction of the magnetic orientation in the MTJ free magnetic stack, in accordance with at least one embodiment described herein.

FIG. 9 provides a high-level logic flow diagram of an illustrative method 900 of writing data to a pSTTM device 100 by altering the direction of the magnetic orientation in the MTJ free magnetic stack, in accordance with at least one embodiment described herein. Passing a current through the MTJ free magnetic stack 110 can alter the magnetic orientation of the MTJ free magnetic stack 110 between a first configuration (e.g., UP) and a second configuration (e.g., DOWN). In some implementations, such a change in magnetic state may be accomplished based on the direction of the current passing through the MTJ free magnetic stack 110. The method 900 commences at 902.

At 904, a write current is selectively passed through the pSTTM device 100 to set the magnetic state of the MTJ free magnetic layer 110. In some implementations, a transistor 160 may control the current flow through the MTJ free magnetic stack 110. The gate 166 of the transistor 160 may be coupled to a word line 180. The source 162 of the transistor 160 may be conductively coupled to a source line 140. The drain of the transistor 164 may be conductively coupled to fixed magnetic layer 130 of the MTJ device 102. The free magnetic stack 110 of the MTJ may be conductively coupled to a bit line 120. Thus the potential difference between the bit line 120 and the source line 140 may determine the direction of current flow through the MTJ device 102 and thus, the direction of the magnetic state of the MTJ free magnetic stack 110. The resistance of the MTJ device 102 varies with the direction of the magnetic state of the MTJ free magnetic stack 110. The method 900 concludes at 906.

Figure 10:
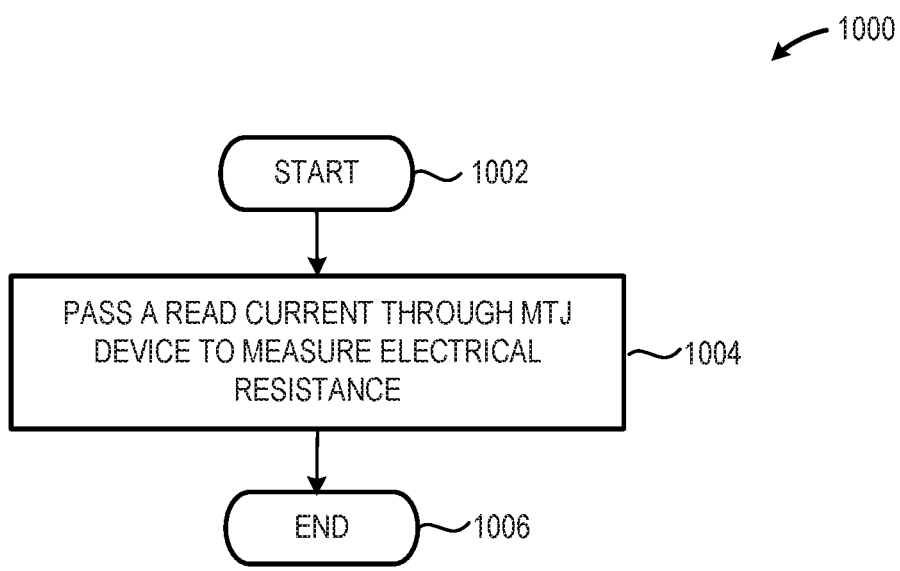
FIG. 10 provides a high-level logic flow diagram of an illustrative method of reading data from a pSTTM device by passing a read current through the pSTTM device and measuring the resistance of the MTJ device, in accordance with at least one embodiment described herein.

FIG. 10 provides a high-level logic flow diagram of an illustrative method 900 of reading data from a pSTTM device 100 by passing a read current through the pSTTM device 100 and measuring the resistance of the MTJ device 102, in accordance with at least one embodiment described herein. The method 1000 commences at 1002.

At 1004, a read current is selectively passed through the pSTTM device 100 to measure the resistance of pSTTM device 100. The direction of the magnetic field of the MTJ free magnetic layer 110 determines the resistance of the pSTTM device 100. The read current is less than the write current such that the passage of the read current through the MTJ device 102 does not change the memory state of the MTJ free magnetic stack 110. The method 1000 concludes at 1006.

Additionally, operations for the embodiments have been further described with reference to the above figures and accompanying examples. Some of the figures may include a logic flow. Although such figures presented herein may include a particular logic flow, it can be appreciated that the logic flow merely provides an example of how the general functionality described herein can be implemented. Further, the given logic flow does not necessarily have to be executed in the order presented unless otherwise indicated. The embodiments are not limited to this context.

Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications. Thus, the breadth and scope of the present invention should not be limited by any of the above-described exemplary embodiments, but should be defined only in accordance with the following claims and their equivalents.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents. Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications.

Reference throughout this specification to "one embodiment" or "an embodiment" means that a particular feature, structure, or characteristic described in connection with the embodiment is included in at least one embodiment. Thus, appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

According to example 1, there is provided a magnetic tunnel junction (MTJ) free magnetic stack. The MTJ free magnetic stack may include a plurality of non-magnetic insert layers; and a plurality of magnetic layer interleaved with the plurality of non-magnetic insert layers arranged such that a magnetic layer is disposed at the top of the MTJ free magnetic stack and a magnetic layer is disposed proximate the bottom of the MTJ free magnetic stack.

Example 2 may include elements of example 1 where each of the plurality of non-magnetic insert layers comprises a layer having a thickness of from about 0.1 nanometers (nm) to about 0.3 nm.

Example 3 may include elements of example 2 where each of the plurality of non-magnetic insert layers comprises a layer having a similar thickness.

Example 4 may include elements of example 2 where the sum of the thicknesses of the plurality of non-magnetic insert layers comprises a total thickness of from about 0.2 nanometers (nm) to about 0.6 nm.

Example 5 may include elements of example 1 where each of the plurality of non-magnetic layers comprises at least one of: tantalum, tungsten, hafnium, iridium, or molybdenum.

Example 6 may include elements of example 5 where each of the plurality of non-magnetic layers comprises a binary alloy containing two of: tantalum, tungsten, hafnium, iridium, and molybdenum.

Example 7 may include elements of example 6 where each the plurality of non-magnetic layers comprises a binary alloy containing two of: tantalum, tungsten, hafnium, iridium, and molybdenum in a ratio of from about 1:1 to about 1:3.

Example 8 may include elements of example 1 where each of the plurality of magnetic layers comprises a magnetic material that includes at least one of: cobalt, iron, nickel, and boron.

Example 9 may include elements of example 1 where the plurality of magnetic layers comprises a magnetic material having a thickness of from about 0.2 nanometers (nm) to about 1.5 nm.

Example 10 may include elements of example 9 where the sum of the thicknesses of the plurality of magnetic layers provides a total thickness of from about 0.8 nanometers (nm) to about 3 nm.

Example 11 may include elements of any of examples 1 through 10 and may additionally include a cap layer disposed proximate the magnetic layer at the top of the MTJ free magnetic stack; and a dielectric layer disposed proximate the magnetic layer at the bottom of the MTJ free magnetic stack.

According to example 12, there is provided a perpendicular spin transfer torque memory (pSTTM) device that includes a magnetic tunnel junction (MTJ) storage device. The pSTTM device may include a solid-state switching device, that includes: a source coupled to a source line; a gate coupled to a word line; and a drain. The MTJ storage device may include: a first electrode coupled to the solid-state switching device drain; a second electrode coupled to a bit line; a fixed magnetic layer stack coupled to the first electrode; a dielectric layer coupled to the fixed magnetic layer stack, opposite the first electrode; and a free magnetic stack coupled to the second electrode, the free magnetic stack including: a plurality of non-magnetic insert layers; and a plurality of magnetic layer interleaved with the plurality of non-magnetic insert layers arranged such that a magnetic layer is disposed at the top of the MTJ free magnetic stack and a magnetic layer is disposed proximate the bottom of the MTJ free magnetic stack.

Example 13 may include elements of example 12 where each of the plurality of non-magnetic insert layers in the MTJ free magnetic stack comprises a layer having a thickness of from about 0.1 nanometers (nm) to about 0.3 nm.

Example 14 may include elements of example 13 where each of the plurality of non-magnetic insert layers in the MTJ free magnetic stack comprises a layer having a similar thickness.

Example 15 may include elements of example 13 where the sum of the thicknesses of the plurality of non-magnetic insert layers in the MTJ free magnetic stack comprises a total thickness of from about 0.2 nanometers (nm) to about 0.6 nm.

Example 16 may include elements of example 12 where each of the plurality of non-magnetic layers in the MTJ free magnetic stack comprises at least one of: tantalum, tungsten, hafnium, iridium, or molybdenum.

Example 17 may include elements of example 16 where each of the plurality of non-magnetic layers in the MTJ free magnetic stack comprises a binary alloy containing two of: tantalum, tungsten, hafnium, iridium, and molybdenum.

Example 18 may include elements of example 17 where each the plurality of non-magnetic layers in the MTJ free magnetic stack comprises a binary alloy containing at least two of: tantalum, tungsten, hafnium, iridium, and molybdenum in a ratio of from about 1:1 to about 1:3.

Example 19 may include elements of example 12 where each of the plurality of magnetic layers in the MTJ free magnetic stack comprises a magnetic material that includes at least one of: cobalt, iron, nickel and boron.

Example 20 may include elements of example 12 where the plurality of magnetic layers in the MTJ free magnetic stack comprises a magnetic material having a thickness of from about 0.2 nanometers (nm) to about 1.5 nm.

Example 21 may include elements of example 20 where the sum of the thicknesses of the plurality of magnetic layers in the MTJ free magnetic stack provides a total thickness of from about 0.8 nanometers (nm) to about 3 nm.

Example 22 may include elements of any of examples 12 through 21 and the MTJ free magnetic stack may additionally include: a cap layer disposed between the magnetic layer at the top of the MTJ free magnetic stack and the top electrode; and a dielectric layer disposed between the magnetic layer at the bottom of the MTJ free magnetic stack and a fixed magnetic stack.

According to example 23, there is provided an MTJ free magnetic stack manufacturing method. The method may include depositing a plurality of non-magnetic insert layers interleaved with a plurality of magnetic layers such that a magnetic layer is disposed at the top of the MTJ free magnetic stack and a magnetic layer is disposed proximate the bottom of the MTJ free magnetic stack.

Example 24 may include elements of example 23 where depositing a plurality of non-magnetic insert layers may include depositing a plurality of non-magnetic insert layers, each of the plurality of non-magnetic insert layers having a thickness of from about 0.1 nanometers (nm) to about 0.3 nm.

Example 25 may include elements of example 24 where depositing a plurality of non-magnetic insert layers may include depositing a plurality of non-magnetic insert layers, each of the plurality of non-magnetic insert layers having a similar thickness.

Example 26 may include elements of example 24 where depositing a plurality of non-magnetic insert layers may include depositing a plurality of non-magnetic insert layers such that a sum of the thicknesses of the deposited plurality of non-magnetic insert layers yields a total thickness of from about 0.2 nanometers (nm) to about 0.6 nm.

Example 27 may include elements of example 23 where depositing a plurality of non-magnetic insert layers may include depositing a plurality of non-magnetic insert layers, each of the plurality of non-magnetic layers comprising at least one of: tantalum, tungsten hafnium, iridium, or molybdenum.

Example 28 may include elements of example 27 where depositing a plurality of non-magnetic insert layers, each of the plurality of non-magnetic layers comprises at least one of: tantalum, tungsten, hafnium, iridium, or molybdenum may include depositing a plurality of non-magnetic insert layers, each of the plurality of non-magnetic layers comprising a binary alloy containing two of: tantalum, tungsten, hafnium, iridium, and molybdenum.

Example 29 may include elements of example 28 where depositing a plurality of non-magnetic insert layers, each of the plurality of non-magnetic layers comprising a binary alloy containing two of: tantalum, tungsten, and molybdenum may include depositing a plurality of non-magnetic insert layers, each of the plurality of non-magnetic layers comprising a binary alloy containing two of: tantalum, tungsten, hafnium, iridium, and molybdenum as a binary alloy having a ratio of from about 1:1 to about 1:3.

Example 30 may include elements of example 23 where depositing a plurality of magnetic layers may include depositing a plurality of magnetic layers each layer comprising a magnetic material that includes at least one of: cobalt, iron, nickel, and boron.

Example 31 may include elements of example 30 where depositing a plurality of magnetic layers each comprising a magnetic material that includes cobalt, iron, nickel, and boron may include depositing a plurality of magnetic layers each layer comprising a magnetic material that includes at least one of: cobalt, iron, nickel, and boron and having a thickness of from about 0.2 nanometers (nm) to about 1.5 nm.

Example 32 may include elements of example 31 where depositing a plurality of magnetic layers each layer comprising a magnetic material that includes at least one of: cobalt, iron, nickel, and boron and having a thickness of from about 0.2 nanometers (nm) to about 1.5 nm may include depositing a plurality of magnetic layers each layer comprising a magnetic material that includes at least one of: cobalt, iron, nickel, and boron and having a thickness of from about 0.2 nanometers (nm) to about 1.5 nm such that a sum of the thicknesses of the plurality of magnetic layers forms a total thickness of from about 0.8 nanometers (nm) to about 3 nm.

Example 33 may include elements of any of examples 23 through 32 and may additionally include depositing a cap layer proximate the magnetic layer at the top of the MTJ free magnetic stack; and depositing a dielectric layer proximate the magnetic layer at the bottom of the MTJ free magnetic stack.

Example 34 may include elements of example 23 where depositing a plurality of non-magnetic insert layers may include depositing each of the plurality of non-magnetic insert layers via physical vapor deposition.

According to example 35, there is provided a perpendicular spin transfer torque memory (pSTTM) data storage method. The storage method may include selectively passing a write current through a magnetic tunnel junction (MTJ) device that includes an MTJ free magnetic stack to store digital data by altering the magnetic spin orientation of the MTJ free magnetic stack between an upward direction and a downward direction, the MTJ free magnetic stack including: a plurality of non-magnetic insert layers; and a plurality of magnetic layers interleaved with the plurality of non-magnetic insert layers, arranged such that a magnetic layer is disposed at the top of the MTJ free magnetic stack and a magnetic layer is disposed proximate the bottom of the MTJ free magnetic stack.

Example 36 may include elements of example 35 and may additionally include passing a read current through the MTJ device to selectively measure an electrical resistance of the MTJ device.

Example 37 may include elements of any of examples 35 or 36 where selectively passing a write current through a magnetic tunnel junction (MTJ) device that includes an MTJ free magnetic stack may include adjusting a voltage applied to at least one of: a source line conductively coupled to a fixed magnetic layer of the MTJ device or a bit line conductively coupled to the MTJ free magnetic stack.

According to example 38, there is provided an MTJ free magnetic stack manufacturing system. The system may include a means for depositing a plurality of non-magnetic insert layers interleaved with a plurality of magnetic layers such that a magnetic layer is disposed at the top of the MTJ free magnetic stack and a magnetic layer is disposed proximate the bottom of the MTJ free magnetic stack.

Example 39 may include elements of example 38 where the means for depositing a plurality of non-magnetic insert layers may include a means for depositing a plurality of non-magnetic insert layers, each of the plurality of non-magnetic insert layers having a thickness of from about 0.1 nanometers (nm) to about 0.3 nm.

Example 40 may include elements of example 39 where the means for depositing a plurality of non-magnetic insert layers may include a means for depositing a plurality of non-magnetic insert layers, each of the plurality of non-magnetic insert layers having a similar thickness.

Example 41 may include elements of example 39 where the means for depositing a plurality of non-magnetic insert layers may include a means for depositing a plurality of non-magnetic insert layers such that a sum of the thicknesses of the deposited plurality of non-magnetic insert layers yields a total thickness of from about 0.2 nanometers (nm) to about 0.6 nm.

Example 42 may include elements of example 38 where the means for depositing a plurality of non-magnetic insert layers may include a means for depositing a plurality of non-magnetic insert layers, each of the plurality of non-magnetic layers comprising at least one of: tantalum, tungsten, hafnium, iridium, or molybdenum.

Example 43 may include elements of example 42 where the means for depositing a plurality of non-magnetic insert layers, each of the plurality of non-magnetic layers comprises at least one of: tantalum, tungsten, hafnium, iridium, or molybdenum may include a means for depositing a plurality of non-magnetic insert layers, each of the plurality of non-magnetic layers comprising a binary alloy containing two of: tantalum, tungsten, hafnium, iridium, and molybdenum.

Example 44 may include elements of example 43 where the means for depositing a plurality of non-magnetic insert layers, each of the plurality of non-magnetic layers comprising a binary alloy containing two of: tantalum, tungsten, hafnium, iridium, and molybdenum may include a means for depositing a plurality of non-magnetic insert layers, each of the plurality of non-magnetic layers comprising a binary alloy containing two of: tantalum, tungsten, hafnium, iridium, and molybdenum as a binary alloy having a ratio of from about 1:1 to about 1:3.

Example 45 may include elements of example 38 where the means for depositing a plurality of magnetic layers may include a means for depositing a plurality of magnetic layers, each layer comprising a magnetic material that includes at least one of: cobalt, iron, nickel, and boron (CoFeB).

Example 46 may include elements of example 45 where the means for depositing a plurality of magnetic layers each comprising a magnetic material that includes at least one of: cobalt, iron, nickel, and boron may include a means for depositing a plurality of magnetic layers each layer comprising a magnetic material that includes at least one of: cobalt, iron, nickel, and boron and having a thickness of from about 0.2 nanometers (nm) to about 1.5 nm.

Example 47 may include elements of example 46 where the means for depositing a plurality of magnetic layers each layer comprising a magnetic material that includes cobalt, iron, nickel, and boron and having a thickness of from about 0.2 nanometers (nm) to about 1.5 nm may include a means for depositing a plurality of magnetic layers each layer comprising a magnetic material that includes cobalt, iron, nickel, and boron and having a thickness of from about 0.2 nanometers (nm) to about 1.5 nm such that a sum of the thicknesses of the plurality of magnetic layers forms a total thickness of from about 0.8 nanometers (nm) to about 3 nm.

Example 48 may include elements of any of examples 23 through 32 and may additionally include a means for depositing a cap layer proximate the magnetic layer at the top of the MTJ free magnetic stack; and a means for depositing a dielectric layer proximate the magnetic layer at the bottom of the MTJ free magnetic stack.

According to example 49, there is provided a system that includes the pSTTM memory device of any of claims 12 through 22.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents.

What is claimed:

1. A magnetic tunnel junction (MTJ) free magnetic stack, comprising:
    a plurality of non-magnetic insert layers, wherein each non-magnetic insert layer of the plurality of non-magnetic insert layers has a same composition, the composition comprising a binary alloy; and
    a plurality of magnetic layers interleaved with the plurality of non-magnetic insert layers, the plurality of magnetic layers arranged such that a magnetic layer of the plurality of magnetic layers is disposed proximate the top of the MTJ free magnetic stack and another magnetic layer of the plurality of magnetic layers is disposed proximate the bottom of the MTJ free magnetic stack.

2. The MTJ free magnetic stack of claim 1 wherein each non-magnetic insert layer of the plurality of non-magnetic insert layers comprises a non-magnetic insert layer having a thickness of from about 0.1 nanometers (nm) to about 0.4 nm.

3. The MTJ free magnetic stack of claim 2 wherein each non-magnetic insert layer of the plurality of non-magnetic insert layers comprises a non-magnetic insert layer having a similar thickness.

4. The MTJ free magnetic stack of claim 2 wherein the sum of the thicknesses of the plurality of non-magnetic insert layers comprises a total thickness of from about 0.2 nanometers (nm) to about 0.8 nm.

5. The MTJ free magnetic stack of claim 1 wherein each non-magnetic insert layer of the plurality of non-magnetic insert layers comprises at least one of: tantalum, tungsten, hafnium, iridium, or molybdenum.

6. The MTJ free magnetic stack of claim 5 wherein each non-magnetic insert layer of the plurality of non-magnetic insert layers comprises a binary alloy containing two of: tantalum, tungsten, hafnium, iridium, and molybdenum.

7. The MTJ free magnetic stack of claim 6 wherein each non-magnetic insert layer of the plurality of non-magnetic insert layers comprises a binary alloy containing two of: tantalum, tungsten, hafnium, iridium, and molybdenum in a ratio of from about 1:1 to about 1:3.

8. The MTJ free magnetic stack of claim 1 wherein each magnetic layer of the plurality of magnetic layers comprises a magnetic material that includes at least one of: cobalt, iron, nickel, and boron.

9. The MTJ free magnetic stack of claim 1 wherein each magnetic layer of the plurality of magnetic layers comprises a magnetic material having a thickness of from about 0.2 nanometers (nm) to about 1.5 nm.

10. The MTJ free magnetic stack of claim 9 wherein the sum of the thicknesses of the plurality of magnetic layers provides a total thickness of from about 0.8 nanometers (nm) to about 3 nm.

11. The MTJ free magnetic stack of claim 1, further comprising:
    a first dielectric layer disposed proximate the magnetic layer at the top of the MTJ free magnetic stack; and
    a second dielectric layer disposed proximate the magnetic layer at the bottom of the MTJ free magnetic stack.

12. An MTJ free magnetic stack manufacturing method comprising:
    interleaving a plurality of non-magnetic insert layers with a plurality of magnetic layers, the plurality of non-magnetic insert layer and the plurality of magnetic layers arranged such that a magnetic layer of the plurality of magnetic layers is disposed proximate the top of the MTJ free magnetic stack and another magnetic layer of the plurality of magnetic layers is disposed proximate the bottom of the MTJ free magnetic stack, wherein each non-magnetic insert layer of the plurality of non-magnetic insert layers has a same composition, the composition comprising a binary alloy.

13. The method of claim 12 wherein interleaving a plurality of non-magnetic insert layers with a plurality of magnetic layers comprises:
    depositing a plurality of non-magnetic insert layers, each non-magnetic insert layer of the plurality of non-magnetic insert layers having a thickness of from about 0.1 nanometers (nm) to about 0.4 nm.

14. The method of claim 13 wherein depositing a plurality of non-magnetic insert layers comprises:
    depositing a plurality of non-magnetic insert layers, each non-magnetic insert layer of the plurality of non-magnetic insert layers having a similar thickness.

15. The method of claim 13 wherein depositing a plurality of non-magnetic insert layers comprises:
    depositing a plurality of non-magnetic insert layers such that a sum of the thicknesses of the deposited plurality of non-magnetic insert layers yields a total thickness of from about 0.2 nanometers (nm) to about 0.8 nm.

16. The method of claim 13 wherein depositing a plurality of non-magnetic insert layers comprises:
    depositing a plurality of non-magnetic insert layers, each non-magnetic insert layer of the plurality of non-magnetic insert layers comprising at least one of: tantalum, tungsten, hafnium, iridium, or molybdenum.

17. The method of claim 16 wherein depositing a plurality of non-magnetic insert layers, each non-magnetic insert layer of the plurality of non-magnetic insert layers comprising at least one of: tantalum, tungsten, hafnium, iridium, or molybdenum further comprises:
    depositing a plurality of non-magnetic insert layers, each of the plurality of non-magnetic layers comprising a binary alloy containing two of: tantalum, tungsten, hafnium, iridium, and molybdenum.

18. The method of claim 17 wherein depositing a plurality of non-magnetic insert layers, each non-magnetic insert layer of the plurality of non-magnetic insert layers comprising a binary alloy containing two of: tantalum, tungsten, hafnium, iridium, and molybdenum further comprises:
    depositing a plurality of non-magnetic insert layers, each non-magnetic insert layer of the plurality of non-magnetic insert layers comprising a binary alloy containing two of: tantalum, tungsten, hafnium, iridium, and molybdenum as a binary alloy having a ratio of from about 1:1 to about 1:3.

19. The method of claim 12 wherein interleaving a plurality of non-magnetic insert layers with a plurality of magnetic layers comprises:
    depositing a plurality of magnetic layers each magnetic layer of the plurality of magnetic layers comprising a magnetic material that includes at least one of: cobalt, iron, nickel, and boron.

20. The method of claim 19 wherein depositing a plurality of magnetic layers each magnetic layer of the plurality of magnetic layers comprising a magnetic material that includes at least one of: cobalt, iron, nickel, and boron comprises:
    depositing a plurality of magnetic layers each magnetic layer of the plurality of magnetic layers comprising a magnetic material that includes at least one of: cobalt, iron, nickel, and boron and having a thickness of from about 0.2 nanometers (nm) to about 1.5 nm.

21. The method of claim 20 wherein depositing a plurality of magnetic layers each magnetic layer of the plurality of magnetic layers comprising a magnetic material that includes cobalt, iron, nickel, and boron and having a thickness of from about 0.2 nanometers (nm) to about 1.5 nm comprises:
    depositing a plurality of magnetic layers each magnetic layer of the plurality of magnetic layers comprising a magnetic material that includes cobalt, iron, nickel, and boron and having a thickness of from about 0.2 nanometers (nm) to about 1.5 nm such that a sum of the thicknesses of the plurality of magnetic layers forms a total thickness of from about 0.8 nanometers (nm) to about 3 nm.

22. The method of claim 12, further comprising:
    depositing a first dielectric layer disposed proximate the magnetic layer at the top of the MTJ free magnetic stack; and
    depositing a second dielectric layer disposed proximate the magnetic layer at the bottom of the MTJ free magnetic stack.

23. The method of claim 13 wherein depositing a plurality of non-magnetic insert layers comprises:
    depositing each non-magnetic insert layer of the plurality of non-magnetic insert layers via physical vapor deposition.

24. A magnetic tunnel junction (MTJ) free magnetic stack, comprising:
    a plurality of non-magnetic insert layers, wherein each non-magnetic insert layer of the plurality of non-magnetic insert layers comprises at least one of: tantalum, tungsten, hafnium, iridium, or molybdenum, and wherein each non-magnetic insert layer of the plurality of non-magnetic insert layers comprises a binary alloy containing two of: tantalum, tungsten, hafnium, iridium, and molybdenum; and a plurality of magnetic layers interleaved with the plurality of non-magnetic insert layers, the plurality of magnetic layers arranged such that a magnetic layer of the plurality of magnetic layers is disposed proximate the top of the MTJ free magnetic stack and another magnetic layer of the plurality of magnetic layers is disposed proximate the bottom of the MTJ free magnetic stack.

25. An MTJ free magnetic stack manufacturing method comprising:

interleaving a plurality of non-magnetic insert layers with a plurality of magnetic layers, the plurality of non-magnetic insert layer and the plurality of magnetic layers arranged such that a magnetic layer of the plurality of magnetic layers is disposed proximate the top of the MTJ free magnetic stack and another magnetic layer of the plurality of magnetic layers is disposed proximate the bottom of the MTJ free magnetic stack wherein depositing a plurality of non-magnetic insert layers comprises: depositing a plurality of non-magnetic insert layers, each non-magnetic insert layer of the plurality of non-magnetic insert layers comprising at least one of: tantalum, tungsten, hafnium, iridium, or molybdenum, and wherein depositing a plurality of non-magnetic insert layers, each non-magnetic insert layer of the plurality of non-magnetic insert layers comprising at least one of: tantalum, tungsten, hafnium, iridium, or molybdenum further comprises: depositing a plurality of non-magnetic insert layers, each of the plurality of non-magnetic layers comprising a binary alloy containing two of: tantalum, tungsten, hafnium, iridium, and molybdenum.

* * * * *